US012600815B2

(12) United States Patent
Fukao et al.

(10) Patent No.: US 12,600,815 B2
(45) Date of Patent: Apr. 14, 2026

(54) STRETCHABLE RESIN COMPOSITION, AND RESIN SHEET MATERIAL, METAL FOIL WITH RESIN, METAL-CLAD LAMINATE, AND WIRING BOARD EACH INCLUDING OR OBTAINED USING SAME

(71) Applicant: PANASONIC INTELLECTUAL PROPERTY MANAGEMENT CO., LTD., Osaka (JP)

(72) Inventors: Tomohiro Fukao, Osaka (JP); Tomoaki Sawada, Osaka (JP); Takatoshi Abe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/819,667

(22) Filed: Aug. 29, 2024

(65) Prior Publication Data

US 2024/0425642 A1 Dec. 26, 2024

Related U.S. Application Data

(63) Continuation of application No. PCT/JP2022/040302, filed on Oct. 28, 2022.

(30) Foreign Application Priority Data

Mar. 7, 2022 (JP) ................................ 2022-034432

(51) Int. Cl.

| | |
|---|---|
| ***H01B 1/22*** | (2006.01) |
| ***C08G 59/02*** | (2006.01) |
| ***C08G 59/32*** | (2006.01) |
| ***C08J 7/04*** | (2020.01) |
| ***C09D 5/24*** | (2006.01) |
| ***C09D 163/00*** | (2006.01) |
| ***H05K 1/03*** | (2006.01) |
| *H05K 1/02* | (2006.01) |

(52) U.S. Cl.

CPC ........ *C08G 59/3209* (2013.01); *C08J 7/0427* (2020.01); *C09D 5/24* (2013.01); *C09D 163/00* (2013.01); *H01B 1/22* (2013.01); *H05K 1/032* (2013.01); *C08J 2363/00* (2013.01); *H05K 1/0283* (2013.01)

(58) Field of Classification Search

CPC ... H01B 1/00; H01B 1/22; C09D 5/24; C08G 59/02; C08L 63/00; C08F 22/20; C08K 2201/001; C08K 3/08; C08K 2003/0806; C08K 2003/085

See application file for complete search history.

(56) References Cited

U.S. PATENT DOCUMENTS

| | | | | |
|---|---|---|---|---|
| 11,702,502 | B2 * | 7/2023 | Hattori | C08G 18/44 523/400 |
| 11,802,175 | B2 * | 10/2023 | Yokoyama | C08G 59/4021 |
| 11,920,049 | B2 * | 3/2024 | Cavalieri | C09D 167/00 |
| 2017/0335053 | A1 * | 11/2017 | Eguchi | C08K 5/54 |
| 2021/0027909 | A1 * | 1/2021 | Fukao | H01B 1/20 |
| 2021/0363308 | A1 | 11/2021 | Michigami et al. | |

FOREIGN PATENT DOCUMENTS

| | | | | |
|---|---|---|---|---|
| JP | 2019-189798 A | | 10/2019 | |
| JP | 2020-023601 A | | 2/2020 | |
| JP | 6851035 B2 | | 3/2021 | |
| WO | WO-2017183722 A1 | * | 10/2017 | |
| WO | WO-2022201985 A1 | * | 9/2022 | C08G 59/14 |

OTHER PUBLICATIONS

McAninch et al "Epoxy-Amine Networks with Varying Epoxy Polydispersity", J. Appl. Polym. Sci. 2015, DOI: 10.1002/APP.41503.*

Wang et al "Curing behavior and kinetics of epoxy resins cured with liquid crystalline curing agent", J Therm Anal Calorim (2012) 107:1205-1211.*

* cited by examiner

*Primary Examiner* — Mark Kopec

(74) *Attorney, Agent, or Firm* — GREENBLUM & BERNSTEIN, P.L.C.

(57) ABSTRACT

An aspect of the present invention relates to a stretchable resin composition containing an epoxy resin and a curing agent, in which the epoxy resin has a weight average molecular weight of 50,000 or more and 3,000,000 or less and a polydispersity of average molecular weights (Mw/Mn) that satisfies the following Formula (1): $1.1 \leq Mw/Mn \leq 3.0$(1) (wherein, Mn represents a number average molecular weight and Mw represents a weight average molecular weight), the curing agent is a crystalline compound, and a glass transition temperature of a cured product of the stretchable resin composition is 60° C. or less.

13 Claims, No Drawings

STRETCHABLE RESIN COMPOSITION, AND RESIN SHEET MATERIAL, METAL FOIL WITH RESIN, METAL-CLAD LAMINATE, AND WIRING BOARD EACH INCLUDING OR OBTAINED USING SAME

FIELD OF INVENTION

The present invention relates to a stretchable resin composition and a resin sheet material, a metal foil with resin, a metal-clad laminate, and a wiring board, which are obtained using the same.

BACKGROUND ART

Thermosetting resins are used in a wide range of fields such as electronic materials and optical materials because of excellent heat resistance, chemical resistance, formability, insulation reliability, and the like thereof. In particular, it has recently been investigated to impart flexibility to thermosetting resins and use the thermosetting resins in flexible devices that can be disposed on curved and uneven surfaces or freely deformed depending on the application. Materials (stretchable resin boards, resin films, and the like) used in such applications are required to have mounting properties and shape followability, and shape restorability during stretching and before and after stretching is important.

As a substrate satisfying such requirements, for example, a resin composition has been reported which contains (A) a polyrotaxane, (B) an epoxy resin, and (C) a curing agent and in which the curing agent (C) contains (C-1) an acid anhydride at 0.1 parts by mass or more and less than 10 parts by mass with respect to 100 parts by mass of the sum of the (A) polyrotaxane, (B) epoxy resin, and (C) curing agent (Patent Literature 1).

For example, a thermosetting composition for formation of stretchable resin has been disclosed, which contains (A) an epoxy resin and (B) a thiol compound having two or more thiol groups and in which (A) the epoxy resin contains (A1) a copolymerized epoxy resin that is a copolymer containing a constitutional unit having an aromatic group or an alicyclic group and a constitutional unit having an oxyalkylene group or an alkylene group having 4 or more carbon atoms (Patent Literature 2). In addition to these, an epoxy resin composition has been reported which contains an epoxy resin obtained by reacting a difunctional aliphatic epoxy compound (X) that is obtained by distilling and purifying the reaction product of a dihydric alcohol having 2 to 12 carbon atoms and epihalohydrin and has a diglycidyl purity of 90% by mass or more and a total chlorine content of 0.3% by mass or less and a dihydric phenol compound (Y) in the presence of a catalyst, and a curing agent having an alicyclic structure (Patent Literature 3).

However, the substrate obtained by the method described in Patent Literature 1 is certainly highly flexible but has low tear strength, and this makes it difficult to apply the substrate to circuit boards. The stretchable resin substrate described in Patent Literature 2 is considered to be stretchable but have the problem of corroding metals. The stretchable resin substrate has a high crosslinking density and poor tear strength. The epoxy resin described in Patent Literature 3 is excellent in flexibility, but has a small molecular weight, so it is difficult to form the epoxy resin into a sheet, and even if a sheet can be formed, it takes a long time to cure the sheet and the productivity is poor. The epoxy resin has a high crosslinking density and poor tear strength.

Patent Literature 1: JP 6851035 B2
Patent Literature 2: JP 2020-23601 A
Patent Literature 3: JP 2019-189798 A

SUMMARY OF THE INVENTION

The present invention has been made in view of the circumstances, and an object thereof is to provide a stretchable resin composition that is equipped with flexibility, heat resistance, and high tear strength.

As a result of intensive studies, the present inventors have found out that the problems can be solved by a stretchable resin composition having the following configuration, and completed the present invention by conducting further studies based on this finding.

In other words, a stretchable resin composition according to an aspect of the present invention is a stretchable resin composition containing at least an epoxy resin and a curing agent, in which the epoxy resin has a weight average molecular weight of 50,000 or more and 3,000,000 or less and a polydispersity of average molecular weights (Mw/Mn) that satisfies the following Formula (1):

$$1.1 \leq Mw/\mathrm{Mn} \leq 3.0 \quad (1)$$

(in formula (1), Mn represents a number average molecular weight and Mw represents a weight average molecular weight), the curing agent is a crystalline compound, and a glass transition temperature of a cured product of the stretchable resin composition is 60° C. or less.

DETAILED DESCRIPTION

Hereinafter, embodiments according to the present invention will be specifically described, but the present invention is not limited thereto.

In the present embodiment, exhibiting “stretchability” means being elastically deformable and exhibiting extensibility, more specifically having an elongation rate before breaking of 10% or more. The cured product of the stretchable resin composition of the present embodiment preferably has a stretching rate of 10% or more and 500% or less, more preferably has a stretching rate of 30% or more and 300% or less. In a case where the stretching rate shows an elongation of 10% or more, the stretchable resin composition has the advantage of exhibiting high followability when deformed into an arbitrary shape and being less likely to be destroyed. The upper limit of the stretching rate is not particularly limited, but in actual use, a stretching rate of 500% is sufficient.

In the present embodiment, the “cured product” refers to a state in which the curing reaction has been completed through a process of applying sufficient energy, such as heat or light, for curing to the resin composition.

The stretchable resin composition according to the present embodiment is a stretchable resin composition containing at least an epoxy resin and a curing agent, in which a weight average molecular weight of the epoxy resin is 50,000 or more and 3,000,000 or less and a polydispersity of average molecular weights (Mw/Mn) satisfies the following Formula (1).

$$1.1 \leq Mw/\mathrm{Mn} \leq 3.0 \quad (1)$$

(in formula (1), Mn is a number average molecular weight and Mw is a weight average molecular weight).

The curing agent is a crystalline compound, and a glass transition temperature of a cured product of the stretchable resin composition is 60° C. or less.

By the configuration, it is possible to provide a stretchable resin composition that is equipped with flexibility, heat resistance, and high tear strength.

The stretchable resin composition according to the present embodiment contains an epoxy resin and a curing agent, and thus has the advantage of being excellent in heat resistance and adhesive properties.

As the weight average molecular weight of the epoxy resin according to the present embodiment is 50,000 or more and 3,000,000 or less, a highly stretchable resin composition can be obtained. As the polydispersity of average molecular weights (Mw/Mn) is 1.1≤Mw/Mn≤3.0, a resin composition having high tear strength can be obtained.

The curing agent according to the present embodiment is a crystalline compound. It is considered that as the stretchable resin composition consists of hard segments and soft segments, a difference in the density of molecular chains is created in the resin composition and stress is dispersed, and this makes it difficult for tear propagation to occur. As a result, a resin composition exhibiting stretchability and high tear strength can be obtained.

As the glass transition temperature (Tg) of the cured product of the stretchable resin composition according to the present embodiment is 60° C. or less, sufficient flexibility and stretchability are secured. The glass transition temperature is more preferably 40° C. or less. It is not particularly required to set the lower limit, but the glass transition temperature is preferably 20° C. or more from the viewpoint of the stickiness of the film surface at normal temperature when the resin composition is formed into a resin film.

As the resin composition of the present invention has the characteristics, the resin composition can be applied not only to IoT and flexible display devices but also to various technical fields such as fields of optics, electronics, bonding, and medical treatment, and is thus greatly advantageous for industrial use.

Hereinafter, the stretchable resin composition of the present embodiment will be specifically described.

(Epoxy Resin)

The stretchable resin composition according to the present embodiment contains an epoxy resin, and thus has the advantage of being excellent in heat resistance and adhesive properties.

As the epoxy resin used in the present embodiment, as described above, any epoxy resin that has a weight average molecular weight of 50,000 or more and 3,000,000 or less and a polydispersity of average molecular weights (Mw/Mn) satisfying the following Formula (1):

$$1.1 \leq Mw/\mathrm{Mn} \leq 3.0 \quad (1)$$

(in formula (1), Mn is a number average molecular weight and Mw is a weight average molecular weight)

can be used without particular limitation.

The lower limit of the weight average molecular weight is more preferably 100,000 or more, still more preferably 200,000 or more. Meanwhile, the upper limit is more preferably 2,000,000 or less, still more preferably 1,000,000 or less. It is not preferable that the weight average molecular weight is less than 50,000 since stretchability and tear strength are poor. It is not preferable that the weight average molecular weight exceeds 3,000,000 since the reactivity is poor and it is required to perform the treatment for curing for a long time. This is not preferable since the viscosity of the resin composition is too high and this makes it difficult to form a film. When the weight average molecular weight is in this range, it is considered that a composition excellent in stretchability and tear strength can be obtained.

The upper limit of the polydispersity of average molecular weights (Mw/Mn) is more preferably 2.5, still more preferably 2.2. It is not preferable that the polydispersity of average molecular weights exceeds 3.0 since the tear strength becomes poor.

As the epoxy resin in the present embodiment, any epoxy resin can be used without particular limitation as long as it has a weight average molecular weight and a polydispersity of average molecular weights in the above ranges.

Specific examples of epoxy resins that can be used in the present embodiment include an epoxy resin containing a polymerization unit (A) of a (meth)acrylate having an epoxy group, a polymerization unit (B) of a (meth)acrylate having a cyano group, and a polymerization unit (C) of a (meth) acrylate having an isobornyl group.

The epoxy resin of the present embodiment preferably does not have unsaturated bonds such as a double bond and a triple bond between carbon atoms. In other words, it is preferable that the carbon atoms of the epoxy resin are bonded to each other by a saturated bond (single bond). By not having unsaturated bonds between carbon atoms, it is considered that the epoxy resin is not oxidized over time and can further maintain the elasticity.

It is preferable that the epoxy resin of the present embodiment is not an epoxy resin obtained by polymerizing only the polymerization unit (A), only the polymerization unit (B), or only the polymerization unit (C), but is a resin obtained by randomly polymerizing the polymerization unit (A), the polymerization unit (B) and the polymerization unit (C). The form of polymerization is not particularly limited, and the epoxy resin may be a block copolymer, an alternating copolymer, a random copolymer, a graft copolymer or the like.

Polymerization Unit (A) of (Meth)Acrylate Having Epoxy Group

This polymerization unit (A) imparts a crosslinking point to the epoxy resin of the present embodiment and enables the epoxy resin to be cured. As this polymerization unit (A) is contained, it is considered that the heat resistance of the cured product after thermal curing is improved by the presence of epoxy group.

The content of the polymerization unit (A) in the epoxy resin is not particularly limited, but is preferably such that the epoxy equivalent weight of the polymerization unit (A) with respect to the total amount of the epoxy resin is about 500 g/eq or more and 15,000 g/eq or less. As the epoxy equivalent weight is in such a range, it is considered that a resin composition exhibiting heat resistance and a proper modulus is obtained more reliably. When the epoxy equivalent weight is less than 500 g/eq, the elastic modulus after curing becomes too high and breakage may occur during elongation. When the epoxy equivalent weight exceeds 15,000 g/eq, the elastic modulus after curing at a high temperature becomes low, and for example, the film may be deformed in the reflow process, resulting in defective mounting. A more preferable range of the epoxy equivalent weight is 1,000 g/eq or more and 5,000 g/eq or less.

Specific examples of the (meth)acrylate monomer constituting the polymerization unit (A) having an epoxy group include glycidyl (meth)acrylate, β-methylglycidyl (meth) acrylate, β-ethylglycidyl (meth)acrylate, glycidyl vinyl ether, o-vinylbenzyl glycidyl ether, m-vinylbenzyl glycidyl ether, p-vinylbenzyl glycidyl ether, o-isopropenylbenzyl glycidyl ether, m-isopropenylbenzyl glycidyl ether, and p-isopropenylbenzyl glycidyl ether. These may be used singly or in combination of two or more kinds thereof.

Polymerization Unit (B) of (Meth)Acrylate Having Cyano Group

By containing a (meth)acrylate having a cyano group, hydrogen bonding with the surface of the metal foil occurs, and there is an advantage that the adhesiveness is excellent when the resin composition or resin film of the present embodiment is used in a metal-clad laminate. By having the polymerization unit (B), it is considered that sufficient tear strength is obtained and heat resistance is also further improved.

Specific examples of the (meth)acrylate monomer constituting the polymerization unit (B) having a cyano group are not particularly limited, but the specific examples include acrylonitrile and methacrylonitrile.

The epoxy resin used in the present embodiment preferably contains a polymerization unit (B) component at 1 part by mass or more and 30 parts by mass or less with respect to 100 parts by mass of the epoxy resin. When the content is in this range, it is considered that the above-described effects can be obtained more reliably. When the content of the polymerization unit (B) component is less than this, the adhesiveness to copper foil may deteriorate. It is not preferable that the content exceeds the above range since the elastic modulus becomes high and the stretchability may be poor. A still more preferable content of the polymerization unit (B) component is 10 parts by mass or more and 20 parts by mass or less with respect to 100 parts by mass of the epoxy resin.

Polymerization Unit (C) of (Meth)Acrylate Having Isobornyl Group

By containing a polymerization unit (C) component having an isobornyl group, it is considered that it is possible to suppress the increase in curing shrinkage and thus to suppress deformation such as warping when the resin composition or resin film is cured.

Specific examples of the acrylate or (meth)acrylate monomer constituting the polymerization unit (C) having an isobornyl group are not particularly limited, but include isobornyl (meth)acrylate.

The epoxy resin of the present embodiment preferably contains the polymerization unit (C) component at 1 part by mass or more and 50 parts by mass or less with respect to 100 parts by mass of the epoxy resin. When the content is in this range, it is considered that the above-described effects can be obtained more reliably. When the content of the polymerization unit (C) component is less than this, the dimensional stability may be poor. It is not preferable that the content exceeds the above range since the reactivity of the polymerization unit (A) of a (meth)acrylate having an epoxy group decreases and the heat resistance of the resin composition after thermal curing is poor. It is also not preferable that the content exceeds the above range from the viewpoint that the viscosity of the resin composition becomes too high. A still more preferable content of the polymerization unit (C) component is 10 parts by mass or more and 30 parts by mass or less with respect to 100 parts by mass of the epoxy resin.

Polymerization Unit Other than the Above

The epoxy resin of the present embodiment may contain other polymerization units in addition to the polymerization units (A), (B), and (C) described above.

Specifically, examples of other polymerization units include an acrylic monomer represented by the following Formula (1) (hereinafter also referred to as polymerization unit (D)).

[Chemical formula 1]

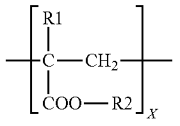

(1)

In Chemical Formula (1), R1 is hydrogen or a methyl group and R2 is hydrogen or an alkyl group. X denotes an integer.

The acrylic monomer represented by Formula (1) preferably has a low glass transition temperature (Tg) in order to impart flexibility to the resin composition of the present embodiment.

Specific examples of the acrylic monomer represented by Formula (1) include ethyl acrylate, butyl acrylate, and 2-ethylhexyl acrylate.

As the epoxy resin of the present embodiment, a commercially available product can be used, for example, TEISANRESIN PMS-14-67 (manufactured by Nagase ChemteX Corporation) and the like can be used.

The proportion of the epoxy resin blended in the resin composition of the present embodiment is not particularly limited as long as the effects of the present invention such as flexibility and adhesiveness are obtained, but is, for example, preferably about 50% to 99% by mass with respect to the total amount of the resin composition.

Furthermore, the resin composition of the present embodiment may contain a resin other than the epoxy resin, and a urethane resin, an acrylic resin, a fluororesin, a silicone resin, an epoxy resin other than those described above, or the like can be further added depending on the purpose.

(Curing Agent)

The resin composition of the present embodiment further contains a curing agent. The curing agent that can be used in the present embodiment is not particularly limited as long as it is a crystalline compound and acts as a curing agent for epoxy resins. By the cohesive force of such a crystalline compound, a resin composition having high tear strength can be obtained.

In the present embodiment, the crystalline compound includes a compound that has a relatively low molecular weight (weight average molecular weight of about 300 or less) and exhibits crystallinity. In this specification, "exhibiting crystallinity" means a state in which molecules are aligned by the regularity of resin composition and $\pi$-$\pi$ interactions. In particular, in the present embodiment, since the curing agent is dissolved in an organic solvent and then mixed with other constituent materials, the curing agent preferably has an attractive force due to interaction, and is preferably a resin having a x bond.

Preferred examples of specific crystalline compounds include compounds that have a molecule having a planar structure such as phenyl, biphenyl, biphenol, or naphthalene in the main chain, have a relatively low molecular weight, and exhibit crystallinity. The crystalline compound of the present embodiment is usually solid at room temperature. The crystalline compounds may be used singly or in combination of two or more kinds thereof depending on the situation.

As the crystalline compound used as the curing agent in the present embodiment, commercially available products can be used, for example, PP-BIOC-F, BIOC-E, BIP-BZ, BIP-PHBZ, 3PC, BI26X-PC, BIR-PC, TEP-DF, TEP-TPA, TEP-BOCP, BIP-ANT, and PAPS-PN2 (all manufactured by ASAHI YUKIZAI CORPORATION) and the like can be used.

In the resin composition of the present embodiment, the amount of the curing agent added can be appropriately set according to the epoxy equivalent weight. Specifically, for example, the amount of the crystalline compound added is preferably 1.0% by mass or more and 20% by mass or less with respect to the total solid amount in the resin composition of the present embodiment. The amount of the crystalline compound added is more preferably 5% by mass or more and 10% by mass or less.

(Curing Accelerator)

The resin composition in the present embodiment may further contain a curing accelerator. The curing accelerator is not particularly limited, but for example, imidazoles and derivatives thereof, organophosphorus-based compounds, metal soaps such as zinc octanoate, secondary amines, tertiary amines, and quaternary ammonium salts can be used. These may be used singly or in combination of two or more kinds thereof depending on the situation.

(Conductive Powder)

The stretchable resin composition of the present embodiment may further contain a conductive powder to be used as a stretchable resin composition equipped with conductivity. This makes it possible to provide a stretchable resin composition that can be used to form a conductive resin sheet or film for stretchable boards having shape recoverability during stretching and small resistance changes before and after stretching.

The metal powder in the present embodiment is not particularly limited as long as it is powder exhibiting conductivity, and elements such as silver, gold, platinum, palladium, copper, nickel, aluminum, magnesium, tungsten, cobalt, zinc, brass, molybdenum, tantalum, niobium, iron, tin, chromium, lead, titanium, manganese, stainless steel, and nichrome, and oxides, nitrides, carbides, alloys, and the like containing these elements can be used. It is also possible to use these metal powders or polymer material powders of which the surface is partly or completely covered with the elements exhibiting conductivity or oxides, nitrides, carbides, alloys, and the like containing these elements. Among these, silver, copper, or the like can be preferably used from the viewpoint of conductivity and cost. These may be used singly or in combination of two or more kinds thereof.

There is no particular limitation on the shape of the metal powder in the present embodiment, but a flat shape is preferable from the viewpoint of conductivity. For example, the aspect ratio of the thickness to the in-plane longitudinal direction is preferably 10 or more. When the aspect ratio is 10 or more, the surface area of the metal powder is large and the conductivity is likely to be secured. From the viewpoint that more favorable conductivity and printability can be secured when the aspect ratio is 1000 or less, the aspect ratio is preferably 10 or more and 1000 or less, more preferably 20 or more and 500 or less. Examples of conductive fillers having such an aspect ratio include conductive fillers having a tap density of 6.0 g/cm$^3$ or less as measured by a tap method. It is more preferable that the tap density is 2.0 g/cm$^3$ or less since the aspect ratio further increases.

The particle size of the metal powder in the embodiment is not particularly limited, but for example, the average particle size (particle size at 50% cumulative volume; D50) measured by a laser light scattering method is preferably 0.1 μm or more and 30.0 μm or less, more preferably 1.0 μm or more and 10 μm or less from the viewpoint of printability during screen printing.

The surface of the metal powder in the embodiment may be subjected to coupling treatment. Alternatively, a coupling agent may be contained in the resin composition of the present embodiment. This affords the advantage that the adhesiveness between the binder resin and the conductive filler is further improved. As a coupling agent to be added to the resin composition or used for coupling treatment of the conductive filler, any coupling agent can be used without particular limitation as long as it adsorbs to or reacts with the filler surface, and specific examples thereof include silane coupling agents, titanate-based coupling agents, and aluminum-based coupling agents. In a case where a coupling agent is used in the present embodiment, the amount thereof added is preferably about 1% by mass to 20% by mass with respect to the total amount of the stretchable resin composition.

In a case where the stretchable resin composition of the present embodiment contains a conductive powder, the proportion of the metal powder blended is not particularly limited as long as conductivity is obtained, but is, for example, preferably 60% to 90% by mass with respect to 100% by mass of the total amount of the epoxy resin and the curing agent. When the content of the metal powder is in the above range, it is considered that the resistance value does not become too large and the composition is superior in extensibility after curing. A more preferable content is 75.0% to 85.0% by mass.

In addition to the metal powder, a conductive or semi-conductive auxiliary conducting agent may also be added to the stretchable resin composition in the embodiment for the purpose of further improving the conductivity. As such a conductive or semi-conductive auxiliary, conductive polymers, ionic liquids, carbon black, acetylene black, carbon nanotubes, inorganic compounds used in antistatic agents, or the like can be used, and one kind of these may be used or two or more kinds of these may be used at the same time. Conductivity can also be imparted using only conductive polymers, ionic liquids, carbon black, acetylene black, carbon nanotubes, inorganic compounds used in antistatic agents, or the like without using the metal powder.

(Other Components)

The resin composition according to the present embodiment may contain other additives, for example, a surfactant, a flame retardant, a flame retardant promoter, a leveling agent, a colorant, a fragrance, a plasticizer, a pH adjuster, a viscosity adjuster, an ultraviolet absorber, an infrared absorber, an antioxidant, a preservative, a lubricant, an auxiliary conducting agent, and inorganic fine particles if necessary in a range in which the effects of the present invention are not impaired.

In the case of blending a metal powder into the stretchable resin composition of the present embodiment, it is preferable to further add a dispersant for the purpose of improving the dispersion stability of the metal powder and resin. The dispersant is not particularly limited as long as it is effective as a dispersant, but examples thereof include copolymers containing acid groups, pigment-affinity block copolymers, phosphate ester-based compounds, polyether phosphate ester-based compounds, fatty acid ester-based compounds, alkylene oxide copolymers, modified polyether polymers, fatty acid derivatives, and urethane polymers. Commercially available dispersants include DISPERBYK series manufactured by BYK; SOLSPERSE series manufactured by The Lubrizol Corporation; Sokalan, Tamol, and Efka series manufactured by BASF; Nuosperse series manufactured by Elementis PLC; DISPARLON series manufactured by Kusumoto Chemicals, Ltd.; FLOWLEN series manufactured by KYOEISHA CHEMICAL Co., Ltd.; and AJISPER series manufactured by Ajinomoto Fine-Techno Co., Inc. These may be used singly or in combination of two or more kinds thereof depending on the situation. It is preferable to use the dispersant so that the content thereof is 0.01% to 10% by mass with respect to the amount of the metal powder contained in the stretchable resin composition.

(Cured Product of Stretchable Resin Composition)

Storage Modulus at 250° C.

In a preferred form, the storage modulus of the cured product of the resin composition according to the present embodiment is 0.1 MPa or more. It is considered that as the storage modulus is in the above range, the cured product of the resin composition can be equipped with heat resistance. In the present embodiment, the "storage modulus" means a storage modulus at 250° C., and is a value measured by the method described in Examples later. From the viewpoint of exerting superior heat resistance, the storage modulus is preferably 0.5 MPa or more, more preferably 1.0 MPa or more. It is not preferable that the storage modulus is 0.1 MPa or less since the crosslinking density is too low and the restorability after elongation may be poor. The upper limit is not particularly limited, but a storage modulus of about 10.0 MPa or less is sufficient. As described above, the resin composition of the present embodiment also has an advantage that a reflow process can be used in the process of mounting electronic parts since the cured product of the resin composition exhibits excellent heat resistance. The storage modulus at 250° C. can be determined by the method described in Examples later.

Tensile Modulus

In a preferred form, the tensile modulus of the cured product of the resin composition according to the present embodiment is 0.1 MPa or more and 0.5 GPa or less. It is considered that this makes it possible to obtain a cured product exhibiting sufficient flexibility. When the tensile modulus is less than 0.1 MPa, there is a tendency that the cured product is too flexible and it is difficult to handle the cured product. When the tensile modulus exceeds 0.5 GPa, the flexibility may be poor. A more preferable range of tensile modulus is 1 MPa or more and 0.1 GPa or less. The tensile modulus can be determined by the method described in Examples later.

(Preparation of Resin Composition and Resin Film)

The method for preparing the resin composition according to the present embodiment is not particularly limited, and for example, the epoxy resin, a curing agent and a solvent are uniformly mixed. The solvent to be used is not particularly limited, and for example, toluene, xylene, methyl ethyl ketone, and acetone can be used. These solvents may be used singly or in combination of two or more kinds thereof. An organic solvent for adjusting the viscosity and various additives may be further blended if necessary.

In a case where the stretchable resin composition contains a conductive (metal) powder, it is preferable to add the metal powder to the mixture obtained by a method as described above. For example, by uniformly mixing and stirring a metal powder, and a curing agent, a dispersant and the like if necessary, and a solvent in the resin composition described above, a resin composition equipped with conductivity can be obtained. The mixing and stirring method is not particularly limited, and high shear dispersion apparatus such as a rotation-revolution mixer or a three roll mill is preferably used. Vacuum defoaming may be performed.

Next, by heating and drying the resin composition obtained as described above and evaporating the solvent, the resin film of the present embodiment can be obtained. In other words, the present embodiment also includes a resin film formed using a resin composition as described above.

The method and apparatus for heating and drying the resin composition and the conditions of these may be the same various means as conventional means or improved means thereof. The specific heating temperature and time can be appropriately set depending on the curing agent, solvent and the like used, but for example, the resin composition can be formed into a resin film by being heated and dried at 130° C. to 200° C. for about 60 to 180 minutes.

The resin film of the present embodiment may be composed only of the above-described resin composition or a semi-cured product thereof, but may be in the form of a resin-coated film having a resin layer containing the resin composition or a semi-cured product thereof; and a support (supporting film). In other words, the present embodiment also includes a resin sheet material including the resin film and a support laminated on this resin film. Examples of the support include electrical insulation films such as a polyimide film, a PET (polyethylene terephthalate) film, a polyester film, a poly(parabanic acid) film, a polyether ether ketone film, a polyphenylene sulfide film, an aramid film, a polycarbonate film, and a polyarylate film.

The resin sheet material of the present embodiment may be a resin sheet material including the resin composition before curing (uncured) (the resin composition in A stage) and a support, or a resin sheet material including a semi-cured product of the resin composition (the resin composition in B stage) and a support.

As the method for fabricating such a resin sheet material, for example, a resin composition in the form of a resin varnish as described above is applied to the surface of a film supporting substrate, and then the solvent is volatilized from the varnish to diminish or remove the solvent, whereby a resin sheet material before curing (in A stage) or in a semi-cured state (B stage) can be obtained.

In the resin sheet material of the present embodiment as well, a resin composition as described above or a semi-cured product thereof may be one obtained by drying or heating and drying the resin composition described above.

In the present embodiment, the "semi-cured product" is one in a state in which the resin composition is partially cured so as to be further cured. In other words, the semi-cured product is the resin composition in a semi-cured state (B-staged). For example, when a resin composition is heated, the viscosity of the resin composition first gradually decreases, then curing starts, and the viscosity gradually increases. In such a case, "semi-cured" refers to a state in which the viscosity has started to increase but curing is not yet completed.

The resin sheet material of the present embodiment also includes a cured resin sheet material obtained by curing a resin-coated film before curing (in A stage) or in a semi-cured state (B stage) as described above.

(Applications of Resin Film and Resin Sheet Material)

The resin film and resin sheet material of the present embodiment can be used as a material and board for all kinds of electronic parts in a variety of applications. In particular, the resin film exhibits excellent flexibility and strength, is equipped with all of adhesiveness, resin flowability, and dimensional stability, and is thus greatly suitable as a material used in, for example, bendable electronic paper, organic EL displays, solar cells, RFID, pressure sensors, wearable devices, and skin patch devices.

(Metal Foil with Resin, Metal-Clad Laminate, and Wiring Board)

Next, a metal foil with resin, a metal-clad laminate, a wiring board, and the like obtained using the resin composition and/or resin film of the present embodiment will be described.

The metal foil with resin of the present embodiment includes a resin layer containing the resin film described above and a metal foil laminated on the resin layer. In other words, the metal foil with resin has a configuration in which the metal foil is laminated on at least one side of the resin layer. The metal foil may be present on both sides of the resin layer. The metal foil with resin of the present embodiment may be a metal foil with resin including a resin layer containing the resin composition before curing (the resin composition in A stage) and a metal foil, or a metal foil with resin including a resin layer containing a semi-cured product of the resin composition (the resin composition in B stage) and a metal foil.

Examples of the method for fabricating such a metal foil with resin include a method in which a resin composition in the form of a resin varnish as described above is applied to the surface of a metal foil such as copper foil and then dried. Examples of the coating method include a bar coater, a comma coater, a die coater, a roll coater, and a gravure coater.

As the metal foil, metal foils used in metal-clad laminates, wiring boards and the like can be used without limitation, and examples thereof include copper foil and aluminum foil.

The thickness and the like of the metal foil and film supporting substrate can be appropriately set depending on the desired purpose.

Drying or heating and drying conditions in the method for fabricating the metal foil with resin are not particularly limited, but a resin composition in the form of a resin varnish is applied to the metal foil, and then heating and drying is performed under the same conditions as those for the resin film to volatilize the solvent from the varnish and diminish or remove the solvent, whereby the metal foil with resin and resin-coated film before curing (in A stage) or in a semi-cured state (B stage) are obtained.

The metal foil with resin and the resin sheet material (resin-coated film) described above may include a cover film and the like if necessary. By including a cover film, it is possible to prevent foreign matter from entering. The cover film is not particularly limited as long as it can be peeled off without damaging the form of the resin composition, and for example, a polyolefin film, a polyester film, a TPX film, films formed by providing a mold releasing agent layer on these films, and paper obtained by laminating these films on a paper substrate can be used.

The metal-clad laminate of the present embodiment includes an insulating layer containing a cured product of the resin composition described above, and a metal foil laminated on the insulating layer. As the metal foil used in the metal-clad laminate, those the same as the metal foils described above can be used.

As the metal-clad laminate of the present embodiment, one or a plurality of the resin films are laminated one on another, and a metal foil such as copper foil is further laminated on both upper and lower sides or on one side, and this is laminated and integrated by heat and press molding, whereby a double-sided metal foil clad or single-sided metal foil clad laminated body can be fabricated. The heating and pressing conditions can be appropriately set depending on the thickness of the laminate to be fabricated, the kind of the resin composition, and the like, but for example, the temperature may be set to 150° C. to 220° C., the pressure may be set to 1.5 to 5.0 MPa, and the time may be set to 60 to 180 minutes.

The wiring board of the present embodiment includes an insulating layer containing the above-described resin film or a cured product of the above-described resin composition, and a wiring. The wiring is provided on at least one selected from the surface or inside of the insulating layer.

The resin composition and resin film of the present embodiment are suitably used as materials for insulating layers of wiring boards. As the method for fabricating the wiring board, for example, the metal foil on the surface of the metal-clad laminated body obtained above is etched to form a circuit (wiring), whereby a wiring board having a conductor pattern (wiring) provided as a circuit on the surface of the laminated body can be obtained. Examples of the circuit forming method include circuit formation by a semi additive process (SAP) or a modified semi additive process (MSAP) in addition to the method described above.

A metal foil with resin, a metal-clad laminate, and a wiring board obtained using the resin composition and resin film of the present embodiment are excellent in flexibility, heat resistance and strength (tensile strength) and are thus extremely useful in industrial applications.

This specification discloses techniques in various aspects as described above, and the main techniques among them are summarized below.

A stretchable resin composition according to a first aspect of the present invention is a stretchable resin composition containing:

an epoxy resin; and a curing agent, in which the epoxy resin has a weight average molecular weight of 50,000 or more and 3,000,000 or less, and a polydispersity of average molecular weights (Mw/Mn) that satisfies the following Formula (1):

$$1.1 \leq Mw/\text{Mn} \leq 3.0 \qquad (1)$$

wherein, Mn represents a number average molecular weight and Mw represents a weight average molecular weight in formula (1), the curing agent is a crystalline compound, and a glass transition temperature of a cured product of the stretchable resin composition is 60° C. or less.

A stretchable resin composition according to a second aspect of the present invention is the stretchable resin composition of the first aspect, in which an epoxy equivalent weight of the epoxy resin is 500 g/eq or more and 15000 g/eq or less.

A stretchable resin composition according to a third aspect of the present invention is the stretchable resin composition according to the first or second aspect, in which the epoxy resin contains a polymerization unit (A) of a (meth)acrylate having an epoxy group, a polymerization unit (B) of a (meth)acrylate having a cyano group, and a polymerization unit (C) of a (meth)acrylate having an isobornyl group.

A stretchable resin composition according to a fourth aspect of the present invention is the stretchable resin composition according to any one of the first to third aspects, in which the epoxy resin contains a polymerization unit (B) component at 1 part by mass or more and 30 parts by mass or less with respect to 100 parts by mass of the epoxy resin.

A stretchable resin composition according to a fifth aspect of the present invention is the stretchable resin composition according to any one of the first to fourth aspects, in which the epoxy resin contains a polymerization unit (C) component at 1 part by mass or more and 50 parts by mass or less with respect to 100 parts by mass of the epoxy resin.

A stretchable resin composition according to a sixth aspect of the present invention is the stretchable resin composition according to any one of the first to fifth aspects, in which a tensile modulus of a cured product of the stretchable resin composition is 0.1 MPa or more and 0.5 GPa or less.

A stretchable resin composition according to a seventh aspect of the present invention is the stretchable resin composition according to any one of the first to sixth aspects, in which a storage modulus of a cured product of the stretchable resin composition is 0.1 MPa or more at 250° C.

A stretchable resin composition according to an eighth aspect of the present invention is the stretchable resin composition according to any one of the first to seventh aspects, in which a crystalline compound among solid components of the stretchable resin composition is contained at 1.0% by mass or more and 20% by mass or less.

A resin sheet material according to a ninth aspect of the present invention includes: the stretchable resin composition according to any one of the first to eighth aspects; and a support laminated on the stretchable resin composition.

A metal foil with resin according to a tenth aspect of the present invention includes: a stretchable resin layer containing the stretchable resin composition according to any one of the first to eighth aspects; and a metal foil laminated on the stretchable resin layer.

A metal-clad laminate according to an eleventh aspect of the present invention includes: an insulating layer containing a cured product of the stretchable resin composition according to any one of the first to eighth aspects; and a metal foil laminated on the insulating layer.

A wiring board according to a twelfth aspect of the present invention includes: an insulating layer containing a cured product of the stretchable resin composition according to any one of the first to eighth aspects; and a wiring provided on at least one selected from a surface or inside of the insulating layer.

A stretchable resin composition according to a thirteenth aspect of the present invention is the stretchable resin composition according to any one of the first to eighth aspects, further containing a conductive powder.

EXAMPLES

First, all kinds of materials used in the present Examples are as follows.

<Method for Preparing Epoxy Resin 1>

Blended were acrylonitrile as a polymerization unit (B), isobornyl acrylate as a polymerization unit (C), and a polymerization unit (D) represented by the following Formula (1) at the proportions (% by weight) presented in Table 1, and glycidyl methacrylate as a polymerization unit (A) was further added so that the epoxy equivalent weight thereof with respect to the total amount of the epoxy resin was the numerical value presented in Table 1. After that, the mixture was subjected to a polymerization reaction to obtain an epoxy resin 1 containing methyl ethyl ketone (MEK) as a solvent ("PMS-14-67" manufactured by Nagase ChemteX Corporation). The solid ratio was 40% by weight, the weight average molecular weight Mw was 290000, and the polydispersity of average molecular weights (Mw/Mn) was 2.1.

[Chem. 2]

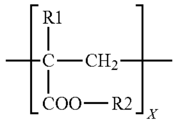

(1)

(in formula (1), R1 is hydrogen or a methyl group and R2 is hydrogen or an alkyl group. X represents an integer.)

<Preparation of Epoxy Resins 2 to 9>

Epoxy resins 2 to 9 were prepared in the same manner as the epoxy resin 1 except that the proportions of the polymerization units (B) to (D) blended were changed to the numerical values presented in Table 1 and the amount of the polymerization unit (A) added was changed so that the epoxy equivalent weight thereof in each epoxy resin was the numerical value presented in Table 1. In the epoxy resins 2 to 9, the solid ratio was 40% by weight.

The number average molecular weight (Mn), weight average molecular weight (Mw), and polydispersity (Mw/Mn) of the epoxy resins 1 to 9 are further summarized in Table 1 below.

Each molecular weight and polydispersity were determined as follows.

First, the dried product of the resin composition obtained above was immersed in THE, and the mixture was thoroughly stirred and subjected to suction filtration through a PTFE membrane filter to remove insoluble matter, whereby a dissolved product of the resin composition was obtained. The molecular weight calibration curve created using a monodisperse polystyrene standard sample was used to calculate the number average molecular weight Mn and weight average molecular weight Mw of the dissolved product thus obtained. The polydispersity Mw/Mn was calculated from these. A gel permeation chromatography instrument (Nexera GPC system manufactured by Shimadzu Corporation) was used to measure the molecular weights of each epoxy resin.

TABLE 1

| | Epoxy resin 1 | Epoxy resin 2 | Epoxy resin 3 | Epoxy resin 4 | Epoxy resin 5 | Epoxy resin 6 | Epoxy resin 7 | Epoxy resin 8 | Epoxy resin 9 |
|---|---|---|---|---|---|---|---|---|---|
| Polymerization unit (B) [% by weight] | 10 | 10 | 10 | 10 | 10 | 10 | 10 | 10 | 30 |
| Polymerization unit (C) [% by weight] | 20 | 20 | 20 | 20 | 20 | 20 | 20 | 20 | 20 |
| Polymerization unit (D) [% by weight] | 70 | 70 | 70 | 70 | 70 | 70 | 70 | 70 | 50 |
| Epoxy equivalent weight [g/eq] | 1818 | 1818 | 1818 | 455 | 12726 | 1818 | 1818 | 1818 | 1818 |

TABLE 1-continued

| | Epoxy resin 1 | Epoxy resin 2 | Epoxy resin 3 | Epoxy resin 4 | Epoxy resin 5 | Epoxy resin 6 | Epoxy resin 7 | Epoxy resin 8 | Epoxy resin 9 |
|---|---|---|---|---|---|---|---|---|---|
| Number average molecular weight Mn [× $10^3$] | 137 | 25 | 1325 | 148 | 143 | 17 | 21 | 1345 | 118 |
| Weight average molecular weight Mw [× $10^3$] | 290 | 51 | 2893 | 301 | 303 | 53 | 43 | 2880 | 274 |
| Polydispersity Mw/Mn | 2.1 | 2.0 | 2.2 | 2.0 | 2.1 | 3.1 | 2.0 | 2.1 | 2.3 |

(Curing Agent)

Crystalline compound 1 ("BIOC-E" manufactured by ASAHI YUKIZAI CORPORATION, crystalline phenol derivative)

| | | | Resin varnish 1 | Resin varnish 2 | Resin varnish 3 | Resin varnish 4 | Resin varnish 5 | Resin varnish 6 | Resin varnish 7 | Resin varnish 8 | Resin varnish 9 | Resin varnish 10 | Resin varnish 11 | Resin varnish 12 | Resin varnish 13 |
|---|---|---|---|---|---|---|---|---|---|---|---|---|---|---|---|
| Epoxy resin | Amorphous | Epoxy resin 1 | 92.82 | | | | | 93.65 | | | | | 77.65 | 88.70 | 86.62 |
| | | Epoxy resin 2 | | 92.82 | | | | | | | | | | | |
| | | Epoxy resin 3 | | | 92.82 | | | | | | | | | | |
| | | Epoxy resin 4 | | | | 78.19 | | | | | | | | | |
| | | Epoxy resin 5 | | | | | 98.08 | | | | | | | | |
| | | Epoxy resin 6 | | | | | | | 92.82 | | | | | | |
| | | Epoxy resin 7 | | | | | | | | 92.82 | | | | | |
| | | Epoxy resin 8 | | | | | | | | | 92.82 | | | | |
| | | Epoxy resin 9 | | | | | | | | | | 92.82 | | | |
| Curing agent | Amorphous | Amine-based curing agent | | | | | | | | | | | 8.54 | | |
| | | Phenol-based curing agent | | | | | | | | | | | | 4.12 | |
| | | Carboxylic acid-based curing agent | | | | | | | | | | | | | 8.26 |
| | Crystalline | Crystalline compound 1 | 2.47 | 2.47 | 2.47 | 8.33 | 0.37 | | 2.47 | 2.47 | 2.47 | 2.47 | | | |
| | | Crystalline compound 2 | | | | | | 2.14 | | | | | | | |
| Curing accelerator | | 2E4MZ | 0.40 | 0.40 | 0.40 | 0.40 | 0.40 | 0.40 | 0.40 | 0.40 | 0.40 | 0.40 | 0.40 | 0.40 | 0.40 |
| Solvent | | MEK | 4.31 | 4.31 | 4.31 | 13.09 | 1.15 | 3.81 | 4.31 | 4.31 | 4.31 | 4.31 | 13.41 | 6.78 | 4.72 |
| Crystalline compound ratio [%] | | | 6.2 | 6.2 | 6.2 | 20.8 | 0.9 | 5.4 | 6.2 | 6.2 | 6.2 | 6.2 | 0.0 | 0.0 | 0.0 |

Crystalline compound 2 ("PAPS-PN2" manufactured by ASAHI YUKIZAI CORPORATION, crystalline phenol derivative)

Amine-based curing agent (amorphous) ("D2000" manufactured by MITSUI FINE CHEMICALS, INC., polyether amine)

Phenol-based curing agent (amorphous) ("ELPC75" manufactured by Gun Ei Chemical Industry Co., Ltd., acid equivalent weight: 211 g/eq.)

Carboxylic acid-based curing agent (amorphous) ("TN-1" manufactured by NOF Corporation, acid equivalent weight: 260 g/eq.)

(Curing Accelerator)

Imidazole-based curing accelerator ("2E4MZ" manufactured by SHIKOKU CHEMICALS CORPORATION, 2-ethyl-4-methylimidazole)

<Fabrication of Resin Films 1 to 13>

Resin varnishes 1 to 13 were prepared by adding a resin composition having the blended composition (parts by mass) presented in Table 2 to a solvent (methyl ethyl ketone) so that the solid content in the composition was approximately 43% by mass. After being left to stand and defoamed, each of the resin varnishes 1 to 13 was applied to a PET film (SP-PET O1 manufactured by Mitsui Chemicals Tohcello, Inc.) using a bar coater. Subsequently, heating was performed in an oven at 80° C. for 60 minutes and further at 160° C. for 5 minutes to obtain semi-cured resin films 1 to 13. The resin films 1 to 6 correspond to resin films (Examples) of the present invention, and the resin films 7 to 13 correspond to examples for comparison.

<Method for Fabricating Cured Resin Films 1 to 13>

The semi-cured resin films 1 to 13 obtained above were each further heated at 180° C. for 1 hour to obtain cured resin films 1 to 13.

[Evaluation Test]

<Method for Measuring Glass Transition Temperature (Tg) and Storage Modulus at 250° C.>

Each of the cured resin films (cured resin films 1 to 13) was cut to 10 mm×30 mm and attached to a dynamic viscoelasticity measuring instrument (DMS6100 manufactured by Seiko Instruments Inc.). The test was performed at a strain amplitude of 10 μm, a frequency of 10 Hz (sine wave), and a rate of temperature increase of 5° C./min, and the peak temperature of tan & calculated was adopted as the glass transition temperature. The storage modulus (MPa) at 250° C. was also measured in the same manner using the measuring instrument.

In this test, Tg of 60° C. or more and a storage modulus of 0.1 MPa or more at 250° C. were evaluated as pass.

<Method for Measuring Tensile Modulus and Elongation at Break>

Each of the cured resin films (cured resin films 1 to 13) was cut into a size 6 dumbbell (JIS K 6251, 2017) and attached to a universal testing machine (AGS-X manufactured by Shimadzu Corporation). The test was performed at a tension speed of 25 mm/min, the slope of r-σ was determined from all stress (σ) data corresponding to strain (r) from 0 to 0.05 by the least squares method, and the initial tensile modulus (MPa) was calculated.

Strain ($r$) = $x/x0$ ($x$ is the gripper moving distance, $x0$ is the initial distance between grippers)

Stress ($\sigma$) = $F/(d \cdot l)$ ($F$ is the test force, $d$ is the film thickness, and $l$ is the width of test piece), and the elongation (%) of each cured resin film at break was measured using the testing machine.

In this test, an initial tensile modulus of 0.1 MPa or more and an elongation at break of 50% or more at 250° C. were evaluated as pass.

<Method for Measuring Tear Strength>

Each of the cured resin films (cured resin films 1 to 13) was cut into a predetermined shape (JIS K 7128-3) and attached to a universal testing machine (AGS-X manufactured by Shimadzu Corporation). The test was performed at a tension speed of 500 mm/min, and the stress at break (N/mm) was measured. In this test, cases where the stress was 30 N/mm or more were evaluated as pass.

The results are summarized in Table 3.

well. By comparison of Example 4 with other Examples, it has been found that the resin film has mechanical strength that can be used in a variety of applications as the epoxy equivalent weight is 500 g/eq or more and the crystalline compound content is 20% by mass or less.

On the other hand, in Comparative Example 1 in which an epoxy resin having a high polydispersity was used, it was not possible to obtain sufficient tear strength. In Comparative Example 2 in which an epoxy resin having a small molecular weight was used, it was not possible to obtain a sufficient elongation at break. In Comparative Example 3 in which an epoxy resin having a too large molecular weight was used, the storage modulus was equal to or less than the measurement limit and it was not possible to obtain sufficient heat resistance. The cured film of Comparative Example 4 could not have a sufficient Tg.

In Comparative Examples 5 to 7, resin films, which did not contain a crystalline compound as a curing agent, were used and thus the tear strength was extremely low.

<Fabrication Example of Semi-Cured Resin-Coated Copper Foil and Cured Resin-Coated Copper Foil>

A semi-cured resin-coated copper foil and a cured resin-coated copper foil were fabricated using the resin varnish 1.

First, the resin varnish 1 obtained above was applied to copper foil (CF-T9DA-SV-18 manufactured by FUKUDA METAL FOIL & POWDER CO., LTD.) using a bar coater.

Subsequently, heating was performed in an oven at 80° C. for 60 minutes and further at 180° C. for 5 minutes to obtain a semi-cured resin-coated copper foil 1 including each of the resin films 1 to 13 and copper foil.

| | Example 1 | Example 2 | Example 3 | Example 4 | Example 5 | Example 6 | Comparative Example 1 |
|---|---|---|---|---|---|---|---|
| Resin film used | 1 | 2 | 3 | 4 | 5 | 6 | 7 |
| Tensile modulus [MPa] | 7.9 | 9.3 | 5.5 | 246.6 | 0.8 | 7.2 | 7.5 |
| Elongation at break [%] | 114.2 | 71.8 | 284.5 | 59.3 | 366.2 | 103.0 | 96.4 |
| Tear strength [N/mm] | 33.0 | 30.5 | 36.2 | 47.9 | 31.7 | 35.0 | 27.4 |
| Glass transition temperature [° C.] | 41.8 | 39.3 | 42.6 | 58.4 | 36.3 | 40.8 | 37.0 |
| Storage modulus at 250° C. [MPa] | 3.9 | 3.3 | 2.8 | 8.9 | 0.1 | 3.1 | 3.4 |

| | Comparative Example 2 | Comparative Example 3 | Comparative Example 4 | Comparative Example 5 | Comparative Example 6 | Comparative Example 7 |
|---|---|---|---|---|---|---|
| Resin film used | 8 | 9 | 10 | 11 | 12 | 13 |
| Tensile modulus [MPa] | 14.2 | 3.7 | 532.3 | 3.4 | 4.0 | 8.8 |
| Elongation at break [%] | 44.4 | 169.0 | 85.4 | 238.0 | 194.0 | 185.0 |
| Tear strength [N/mm] | 30.3 | 35.0 | 31.1 | 11.0 | 13.9 | 12.4 |
| Glass transition temperature [° C.] | 38.5 | 37.4 | 63.3 | 32.8 | 41.5 | 48.3 |
| Storage modulus at 250° C. [MPa] | 3.1 | Equal to or less than measurement limit | 2.4 | 1.1 | 1.3 | 1.2 |

DISCUSSION

From the above results, it has been indicated that the resin films (resin films 1 to 6) obtained using the resin compositions according to the present invention are excellent in heat resistance in the case of being cured into cured films, are equipped with appropriate flexibility, do not break even when elongated greatly, and are excellent in tear strength as Next, the semi-cured resin-coated copper foil 1 obtained above was further heated at 180° C. for 1 hour to obtain a cured resin-coated copper foil 1.

This application is based on Japanese Patent Application No. 2022-34432 filed on Mar. 7, 2022, the contents of which are included in the present application.

In order to express the present invention, the present invention has been described above appropriately and sufficiently through the embodiments with reference to specific examples, drawings and the like. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

The stretchable resin composition of the present invention is equipped with flexibility, heat resistance, and high tear strength. Hence, the present invention is useful in various technical fields such as fields of optics, electronics, bonding, and medical treatment.

The invention claimed is:

1. A stretchable resin composition comprising:

an epoxy resin; and a curing agent, wherein the epoxy resin has a weight average molecular weight of 50,000 or more and 3,000,000 or less, and a polydispersity of average molecular weights (Mw/Mn) that satisfies the following Formula (1):

$$2.0 \leq Mw/\mathrm{Mn} \leq 3.0 \tag{1}$$

wherein, Mn represents a number average molecular weight and Mw represents a weight average molecular weight in formula (1), the curing agent is a crystalline compound, and a glass transition temperature of a cured product of the stretchable resin composition is 60° C. or less.

2. The stretchable resin composition according to claim 1, wherein an epoxy equivalent weight of the epoxy resin is 500 g/eq or more and 15,000 g/eq or less.

3. The stretchable resin composition according to claim 1, wherein the epoxy resin contains a polymerization unit (A) of a (meth) acrylate having an epoxy group, a polymerization unit (B) of a (meth) acrylate having a cyano group, and a polymerization unit (C) of a (meth) acrylate having an isobornyl group.

4. The stretchable resin composition according to claim 3, wherein the epoxy resin contains the polymerization unit (B) component at 1 part by mass or more and 30 parts by mass or less with respect to 100 parts by mass of the epoxy resin.

5. The stretchable resin composition according to claim 3, wherein the epoxy resin contains the polymerization unit (C) component at 1 part by mass or more and 50 parts by mass or less with respect to 100 parts by mass of the epoxy resin.

6. The stretchable resin composition according to claim 1, wherein a tensile modulus of a cured product of the stretchable resin composition is 0.1 MPa or more and 0.5 GPa or less.

7. The stretchable resin composition according to claim 1, wherein a storage modulus of a cured product of the stretchable resin composition is 0.1 MPa or more at 250° C.

8. The stretchable resin composition according to claim 1, wherein a crystalline compound among solid components of the stretchable resin composition is contained at 1.0% by mass or more and 20% by mass or less.

9. The stretchable resin composition according to claim 1, further comprising a conductive powder.

10. A resin sheet material comprising:

the stretchable resin composition according to claim 1; and a support laminated on the stretchable resin composition.

11. A metal foil with resin comprising:

a stretchable resin layer containing the stretchable resin composition according to claim 1; and a metal foil laminated on the stretchable resin layer.

12. A metal-clad laminate comprising:

an insulating layer containing a cured product of the resin composition according to claim 1; and a metal foil laminated on the insulating layer.

13. A wiring board comprising:

an insulating layer containing a cured product of the resin composition according to claim 1; and a wiring provided on at least one selected from a surface or inside of the insulating layer.

* * * * *